(12) United States Patent
Shepard

(10) Patent No.: US 8,325,557 B2
(45) Date of Patent: Dec. 4, 2012

(54) METHODS AND APPARATUS FOR DISABLING A MEMORY-ARRAY PORTION

(75) Inventor: Daniel R. Shepard, North Hampton, NH (US)

(73) Assignee: Contour Semiconductor, Inc., North Billerica, MA (US)

( * ) Notice: Subject to any disclaimer, the term of this patent is extended or adjusted under 35 U.S.C. 154(b) by 197 days.

(21) Appl. No.: 12/639,599

(22) Filed: Dec. 16, 2009

(65) Prior Publication Data

US 2010/0157646 A1    Jun. 24, 2010

Related U.S. Application Data

(60) Provisional application No. 61/203,568, filed on Dec. 23, 2008.

(51) Int. Cl.
*G11C 8/00* (2006.01)
(52) U.S. Cl. ............... 365/230.06; 365/51; 365/243; 365/189.08

(58) Field of Classification Search ............. 365/230.06, 365/51, 243, 189.08
See application file for complete search history.

(56) References Cited

U.S. PATENT DOCUMENTS

| | | | | |
|---|---|---|---|---|
| 4,577,294 | A * | 3/1986 | Brown et al. | 365/200 |
| 4,639,896 | A * | 1/1987 | Brannigan et al. | 365/189.06 |
| 4,985,866 | A * | 1/1991 | Nakaizumi | 365/200 |
| 6,535,418 | B2 * | 3/2003 | Hogan | 365/175 |
| 7,035,152 | B1 * | 4/2006 | Bae et al. | 365/200 |
| 7,180,820 | B2 * | 2/2007 | Kliewer et al. | 365/230.06 |
| 7,764,553 | B2 * | 7/2010 | Riho | 365/189.09 |

* cited by examiner

*Primary Examiner* — Viet Q Nguyen
(74) *Attorney, Agent, or Firm* — Bingham McCutchen LLP

(57) ABSTRACT

A memory device having a plurality of storage locations disposed along a plurality of generally parallel lines includes, connected to the lines, a decoder circuit for selecting one line, and, connected to each line, a line-disabling circuit for selectively preventing the line from being energized during line selection.

18 Claims, 3 Drawing Sheets

METHODS AND APPARATUS FOR DISABLING A MEMORY-ARRAY PORTION

CROSS-REFERENCE TO RELATED APPLICATION

This application claims priority to and the benefit of, and incorporates herein by reference in its entirety, U.S. Provisional Patent Application No. 61/203,568, which was filed on Dec. 23, 2008.

TECHNICAL FIELD

In various embodiments, the present invention relates to the design and operation of solid-state memory arrays, and more particularly to the design and operation of memory arrays for yield improvement.

BACKGROUND

Solid-state memory devices are generally configured as one or more arrays of rows and columns having storage locations at their points of intersection. Such devices may feature multiple sub-arrays (or "tiles") within a single two-dimensional plane and/or multiple arrays stacked in three dimensions. Increasing the capacity of solid-state memory devices involves increasing the number and/or size of the arrays, and, as the storage capacity increases, achieving adequate yield becomes more difficult. In order to improve device yield, memory devices will often incorporate extra "spare" rows and/or columns. These spare rows and/or columns may then electrically replace rows or columns found to be defective during device testing. Other yield-improvement techniques include incorporating error-correcting mechanisms that enable a device to be used despite the presence of a defective row and/or column. However, due to, e.g., electrical interactions between rows and/or columns, often a defective row or column may cripple the performance of other columns or rows in the memory array (or even leave them inoperative). In such cases, the above-described yield enhancements may be insufficient to provide an operable device, and overall product yield decreases.

SUMMARY

In various embodiments, the present invention features designs and fabrication methods for memory arrays having rows and/or columns that may be disabled, thus preventing negative interactions between a defective row and/or column and other rows and columns. Since typical memory devices will incorporate sufficient numbers of rows and columns to properly operate with one or more disabled rows or columns, overall product yield is improved.

In an aspect, embodiments of the invention feature a memory device including or consisting essentially of a memory array, a decoder circuit, and line-disabling circuits. The memory array includes or consists essentially of a plurality of storage locations disposed along a plurality of generally parallel lines. The decoder circuit is connected to the plurality of lines and selects one of the plurality of lines. Each line-disabling circuit is connected to one of the lines and selectively prevents the line from being energized during line selection.

Embodiments of the invention may include one or more of the following. Each of the line-disabling circuits may be programmably actuable, and/or may include a discharge path preventing the associated line from being energized. At least one line-disabling circuit may be configured to enable a previously disabled line. Each line-disabling circuit may include or consist essentially of an antifuse, a fuse, a floating-gate devices, and/or a phase-change device. The decoder circuit may include or consist essentially of a pattern of diodes. A second plurality of generally parallel lines may intersect the plurality of generally parallel lines, and each storage location may be disposed proximate an intersection point. A third plurality of generally parallel lines may intersect both the plurality of generally parallel lines and the second plurality of generally parallel lines. The memory array may be a single block of a multiple-block memory circuit, which may have a three-dimensional topology.

In another aspect, embodiments of the invention feature a method of operating a memory array that includes or consists essentially of a plurality of storage locations disposed along a plurality of lines, each line being connected to a driver device. At least one line is disabled. A voltage is applied to the plurality of lines such that charge is stored at the driver devices corresponding to all but the at least one disabled line. A single line is selected such that the charge stored at the driver devices corresponding to the remaining lines is discharged.

Embodiments of the invention may include one or more of the following. After the single line is selected, the at least one disabled line may be enabled. Disabling the at least one line may include or consist essentially of completing a discharge path from each said at least one line. Completing the discharge path may include or consist essentially of fusing an antifuse connected to the line. The at least one line may be identified as being defective prior to disabling the at least one line. A single second line intersecting the selected line may be selected in order to read or write information at a storage location disposed proximate the intersection point.

In yet another aspect, embodiments of the invention feature a method of operating a memory array comprising or consisting essentially of a plurality of storage locations disposed along a plurality of lines, each line being connected to a driver device and at least one line being disabled. Voltage is applied to the plurality of lines such that charge is stored at the driver devices corresponding to all but the at least one disabled line. A single line is selected such that the charge stored at the driver devices corresponding to the remaining lines is discharged. After the single line is selected, the at least one disabled line may be enabled. A single second line intersecting the selected line may be selected in order to read or write information at a storage location disposed proximate the intersection point.

In a further aspect, embodiments of the invention feature a method of forming a memory device including or consisting essentially of forming a memory array, forming a decoder circuit, and forming line-disabling circuits. The memory array includes or consists essentially of a plurality of storage locations disposed along a plurality of generally parallel lines. The decoder circuit is connected to the plurality of lines and selects one of the plurality of lines. Each line-disabling circuit is connected to one of the lines and selectively prevents the line from being energized during line selection.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention.

In the following description, various embodiments of the present invention are described with reference to the following drawing, in which.

DETAILED DESCRIPTION

Figure 1:
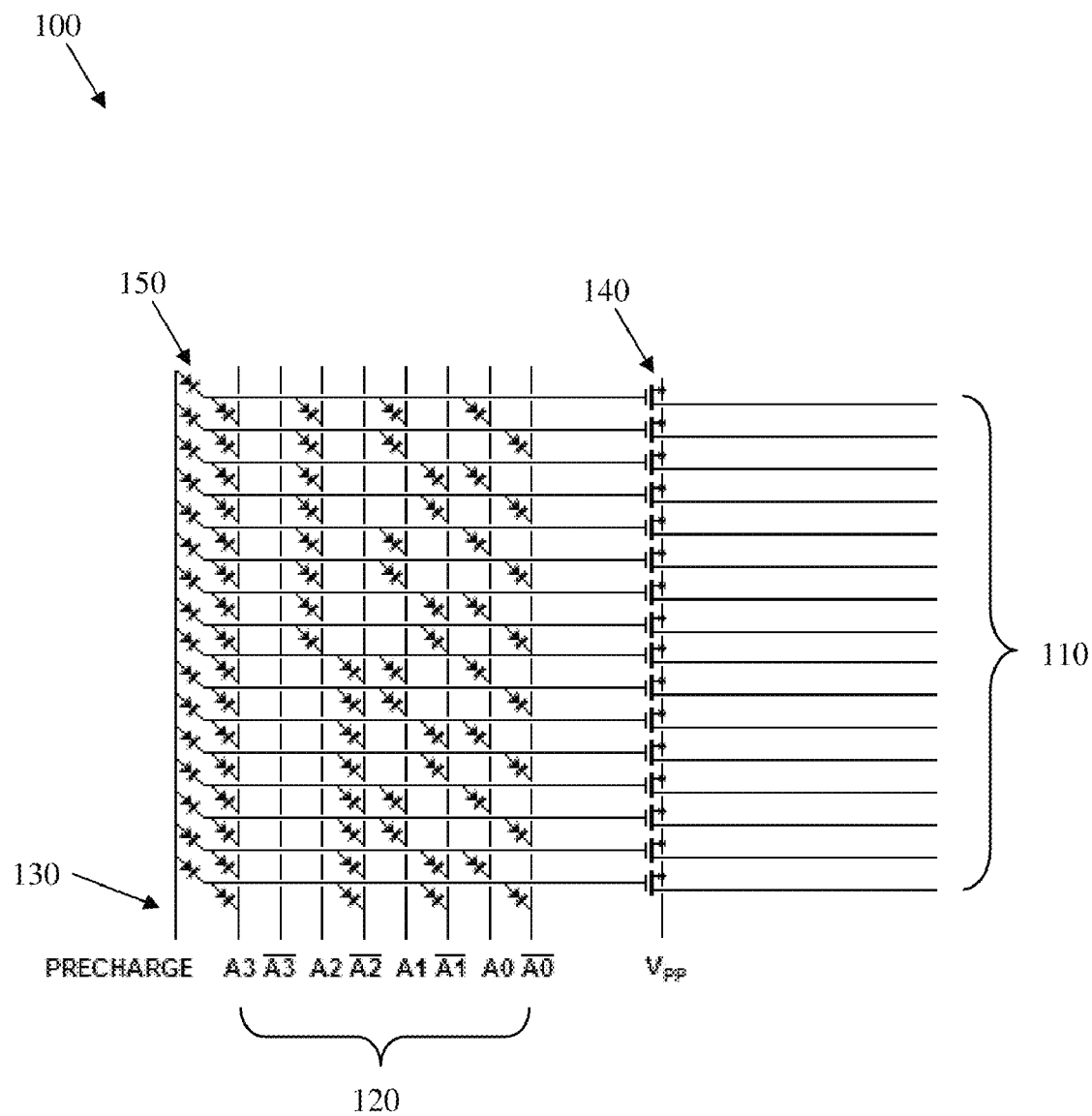
FIG. 1 is a schematic diagram of a portion of a memory array in which row line selection is accomplished by a decoder circuit, in accordance with various embodiments of the invention.

Embodiments of the present invention feature designs and methods of forming memory arrays with rows and/or columns that may be disabled. Herein, disabling rows will be described, but the disclosed techniques and circuits may apply equally to columns, as well as both rows and columns in a single memory device. Referring to FIG. 1, a decoder circuit 100 facilitates the selection of one of rows 110 of a memory array (the remainder of which is not shown) connected to decoder circuit 100. The exemplary embodiment illustrated in FIG. 1 includes 16 rows 110, but embodiments of the invention may (and most frequently will) feature more than 16 rows.

Decoder circuit 100 may be a diode decoder (as shown in FIG. 1), such as that disclosed in U.S. Patent Application Publication No. 2009/0225579, the entire disclosure of which is incorporated by reference herein. As depicted in FIG. 1, decoder circuit 100 has eight address inputs 120 representing four address bits A0-A3 and their complements $\overline{A0}$-$\overline{A3}$. Embodiments of the invention may feature fewer or more than eight address inputs; the embodiment of FIG. 1 is merely an illustrative example.

For decoder circuit 100 to select a single row 110, a voltage in the form of a pulse is applied to precharge input 130. The amplitude of the pulse is sufficient to turn on any of the row drive transistors 140 connected to rows 110, i.e., the pulse amplitude accounts for the turn-on threshold voltage of the row drive transistor 140 and the forward voltage drop of the precharge diode 150, thus placing a charge on the gates of all of the row drive transistors 140. (For ease of depiction, only a single row drive transistor 140 and precharge diode 150 are labeled in FIG. 1.) Then, complementary address inputs are applied, i.e., one address input 120 is driven low while its complement floats or is held at a high voltage, causing the gates of all but one of the row drive transistors 140 to discharge. The remaining row drive transistor 140 retains charge on its gate sufficient to pass the $V_{PP}$ voltage through to the selected row 110. Various embodiments of the present invention feature driver devices other than (or in addition to) row drive transistors, such as switches.

Figure 2:
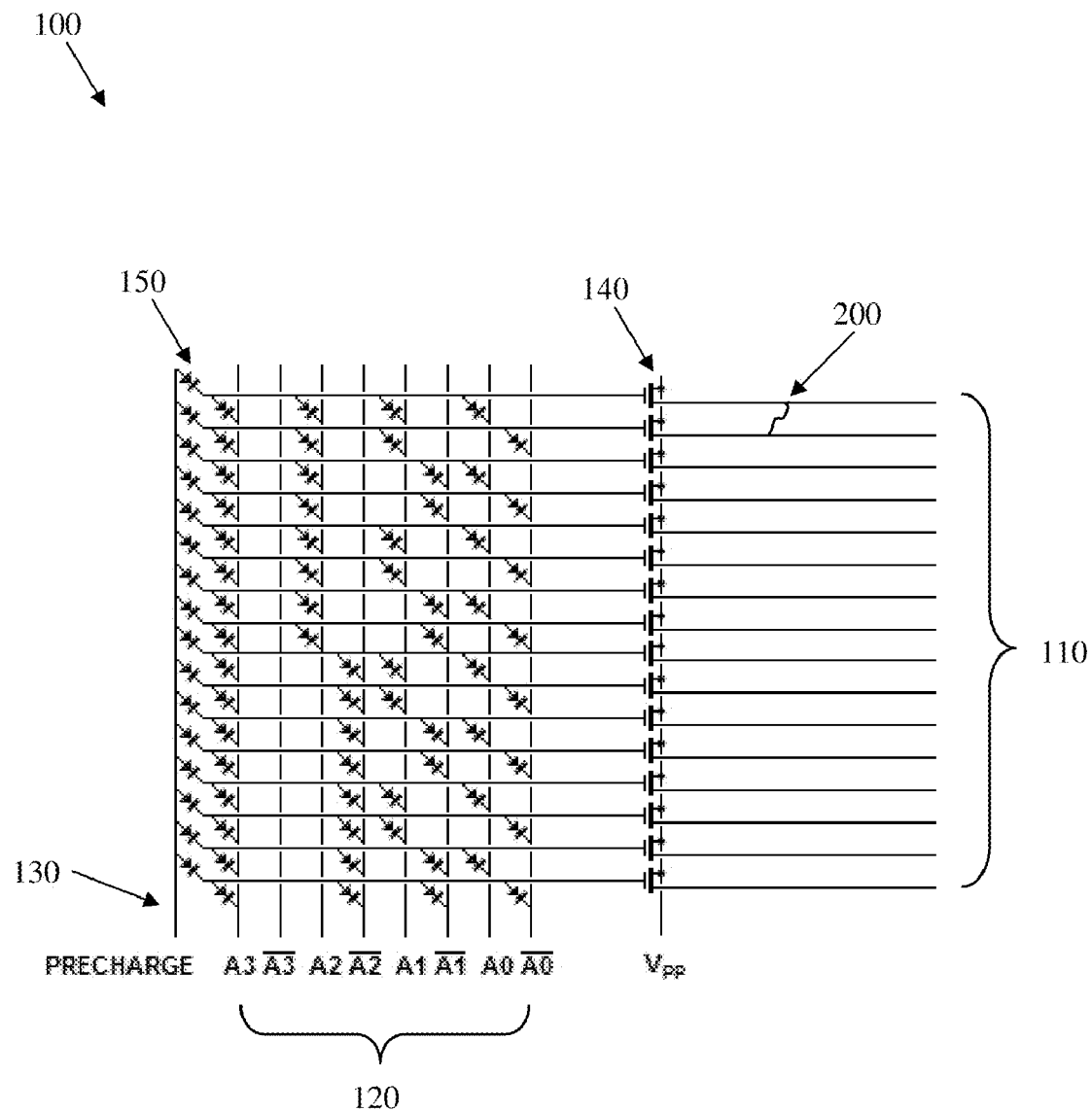
FIG. 2 is a schematic representation of a portion of a memory array in which a defect has shorted two adjacent row lines, in accordance with various embodiments of the invention.

FIG. 2 depicts decoder circuit 100 having a defect 200, e.g., a manufacturing defect, shorting together at least two rows 110 (and shown in FIG. 2 as shorting together the top two rows 110). In the event of such a defect 200, it may be desirable for the affected rows 110 to not be energized by the $V_{PP}$ voltage. For example, in a decoder circuit like that disclosed in U.S. Patent Application Publication No. 2009/0109726, the entire disclosure of which is incorporated by reference herein, non-selected rows are pulled to ground. In some embodiments, one or more spare rows are included in the memory circuit that may be utilized to replace defective rows; however, generally the defective rows should not be energized when the spare rows are utilized and selected. If the defective rows are not disabled, selection thereof may interfere with the spare rows and/or other rows in the array. In other designs, the decoder circuit may be part of a low-power-consumption circuit, and power consumption may be decreased by not energizing defective row(s) during write operations. In the illustrated embodiment, it is impossible to distinguish data bits connected to either of the top two rows; thus, it would be advantageous for both rows to be disabled.

Figure 3:
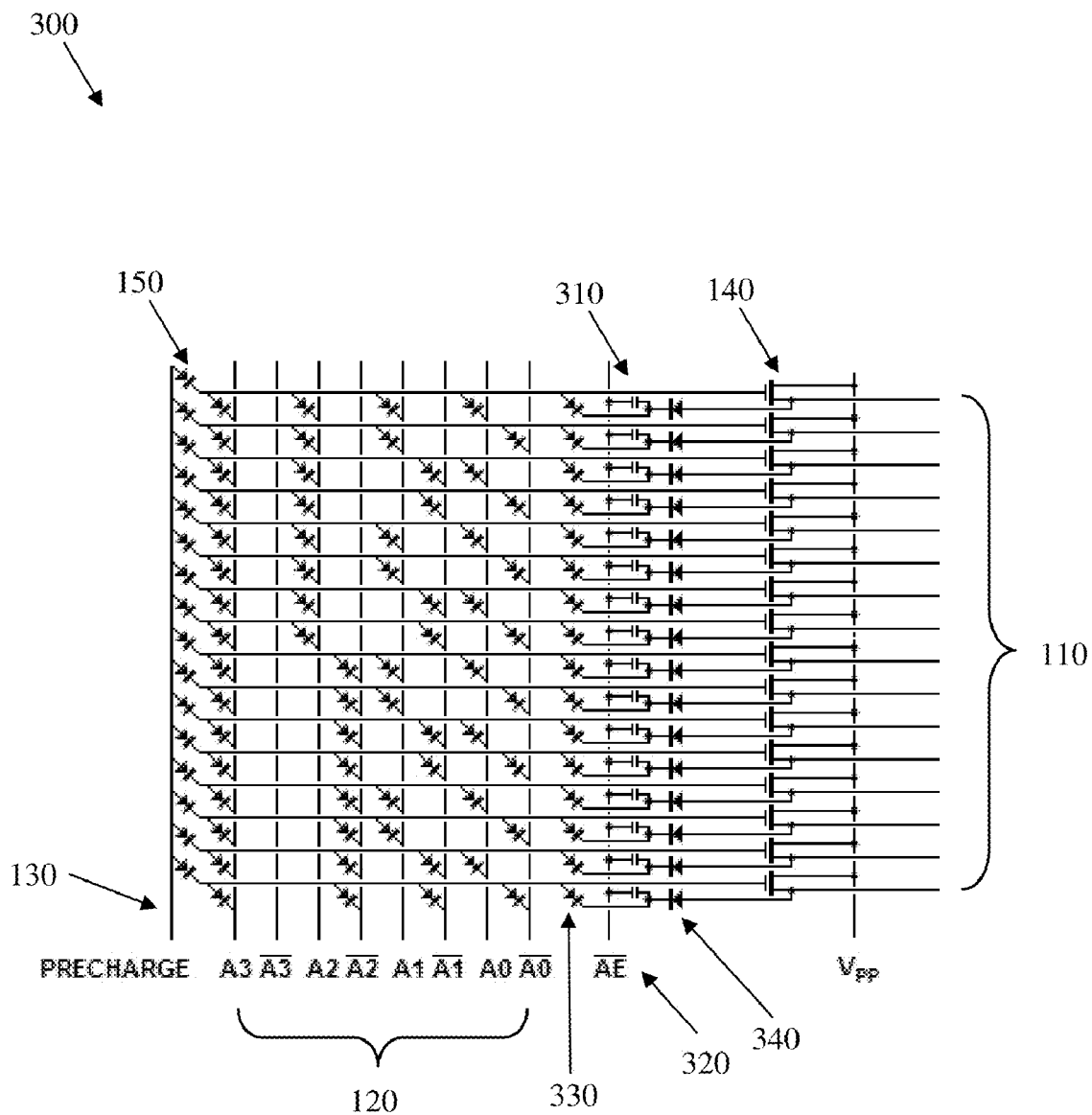
FIG. 3 is a schematic diagram of a portion of a memory array incorporating a row-disabling means in accordance with various embodiments of the invention.

FIG. 3 depicts a decoder circuit 300 incorporating a row-disabling circuit in accordance with embodiments of the present invention. The row-disabling circuit includes an additional discharge path for discharging the gates of row drive transistors 140, as well as a discharge input bus 320 (labeled in FIG. 3 as $\overline{AE}$). In general, when addressing is performed with address inputs 120, discharge input bus 320 is held at a low voltage. In the embodiment depicted in FIG. 3, the row-disabling circuit includes a series of antifuses 310, each in series with an associated diode, the other terminal of which is connected to the discharge input bus 320. Each antifuse 310 and its associated devices may be considered a separate "circuit" associated with and for disabling each row 110. For a row 110 identified as defective (i.e., shorted together or "open"), the antifuse 310 on the row is fused as described below, thus completing the discharge path. When discharge input bus 320 is at low voltage, if an antifuse 310 has been fused (i.e., if the path circuit is closed), the gate of the row drive transistor 140 on that row 110 will be discharged (or alternatively, will not be energized by the precharge voltage pulse), thus disabling the row. In instances other than when an antifuse 310 is being fused to disable its row, the discharge input bus 320 is generally left floating or at a high voltage when sufficient power to fuse an antifuse 310 is applied to Vpp in order to prevent accidental fusing of an antifuse 310 (e.g., when data is being written to the array). Prior to the voltage $V_{PP}$ being applied (as described above), discharge input 320 is left floating or at a high voltage in order to prevent power (from $V_{PP}$) being applied to the now-disabled row 110 through its corresponding row drive transistor 140 across the row's antifuse 310. In this manner, defective rows 110 are disabled prior to row selection, and the overall power consumption of decoder circuit 300 is reduced (since current does not flow through any disabled rows). In general, during programming of the memory array as described below, the columns (or other lines intersecting rows 110) are left unselected to prevent a current path from the columns from diminishing the power available to fuse the antifuses 310 on the rows 110 to be disabled.

Embodiments of the present invention may be combined with the memory access techniques described in U.S. Pat. No. 7,149,934, the entire disclosure of which is incorporated by reference herein. In such embodiments, replacement of defective rows with extra rows is not necessary (and, thus, the number of "spare" rows initially fabricated for the memory array may be decreased, even to zero). Rather, defective row(s) may be disabled as described above, and error correction compensates for the memory storage locations (or "bits") present on each disabled row. Thus, the overall costs and complexity of electrical testing are reduced by obviating the need to replace defective rows.

Embodiments of the present invention may even be implemented after fabrication and packaging of the completed memory device, e.g., by an end user or during the packaging and testing phase after fabrication. In order to disable a given row 100, the row is selected via application of its address to decoder circuit 300, and discharge input 320 is held at low voltage when voltage $V_{PP}$ is applied. Upon application of the $V_{PP}$ voltage (and with no voltage applied to the columns), the antifuse 310 on the selected row 110 fuses, disabling the selected row 110. During such row disabling, once the antifuse is fused, the row driving transistor will start to switch off by discharging its gate through a disable decoding diode 330 and the fused antifuse 310, but the discharge may not be immediate, as the charge on the selected row should be drained away through both a disabling diode 340 and the antifuse 310. Furthermore, in embodiments where two or more rows are shorted together, such rows have the $V_{PP}$ voltage across their antifuses 310 simultaneously, as the selected row also energizes the second row through the short. Depending upon the distance along the row away from the decoder circuit where the short occurs, the second row may have significant series resistance that could hinder the fusing of the second row's antifuse 310. In order to ensure that the antifuses 310 of all of the shorted lines are fully fused, at least one of the shorted rows may be selected more than once in order to ensure that all such antifuses 310 are fused. In some embodiments, the rows of the array have limited series resistance, rendering such multiple selections superfluous.

Many variants of the present invention will be obvious to one skilled in the art in light of the present teaching. The row-disabling circuit may be utilized on columns (or other lines intersecting the rows), and/or may utilize "disabling" devices other than antifuses 310, including fuses or programmable devices such as phase-change material-based devices and Flash-memory-like floating-gate devices. In three-dimensional memory arrays, lines orthogonal to both columns and rows may be disabled, as may lines selecting one of several sub-arrays or portions thereof.

Embodiments may be implemented with cross-point memory arrays and these arrays may be one of many tiles or sub-arrays in a larger device or an array within a three-dimensional arrangement of arrays or tiles. The storage cells may include various non-linear elements, e.g., transistors, field-emitters, diodes, or any other device that conducts current better in one direction than the other for a given applied voltage. The storage element may be or comprise a fuse, an antifuse, a phase-change material such as a chalcogenide (including a chalcogenide in which the programmed resistivity may be one of two resistance values and, in the case of more than one bit per cell storage cells, in which the programmed resistivity may be one of three or more resistance values), or a field-emitter element programming mechanism including an element for which the resistance or the volume is changeable and programmable. Orientation of the array may be rotated, i.e., the "rows" may be "columns," or vice versa.

Embodiments of the present invention may be utilized in memory devices used in systems for storing digital text, digital books, digital music, digital audio, digital photography (wherein one or more digital still images is stored, including sequences of digital images), digital video, digital cartography (wherein one or more digital maps is stored), and any other digital or digitized information as well as any combinations thereof. These memory devices may be embedded, removable, or removable and interchangeable among other devices that access the data therein. They may be packaged in any variety of industry-standard form factors such as Compact Flash, Secure Digital, MultiMedia Cards, PCMCIA Cards, Memory Stick, and/or any of a large variety of integrated circuit packages including Ball Grid Arrays, Dual In-Line Packages (DIPs), SOICs, PLCCs, TQFPs, and the like, as well as in proprietary form factors and custom-designed packages. These packages may contain just the memory chip, multiple memory chips, or one or more memory chips along with other logic devices or other storage devices such as PLDs, PLAs, micro-controllers, microprocessors, memory controller chips or chip-sets, or other custom or standard circuitry. Packaging may include a connector for making electrical contact with another device when the device is removable or removable and interchangeable.

The terms and expressions employed herein are used as terms and expressions of description and not of limitation, and there is no intention, in the use of such terms and expressions, of excluding any equivalents of the features shown and described or portions thereof. In addition, having described certain embodiments of the invention, it will be apparent to those of ordinary skill in the art that other embodiments incorporating the concepts disclosed herein may be used without departing from the spirit and scope of the invention. Accordingly, the described embodiments are to be considered in all respects as only illustrative and not restrictive.

What is claimed is:

1. A memory device comprising:
a memory array comprising a plurality of storage locations disposed along a plurality of generally parallel lines;
connected to each of the plurality of lines, a driver device for energizing the line connected thereto;
a decoder circuit for selecting one of the driver devices connected to a line to energize; and
connected to each of the driver devices, a line-disabling circuit for selectively preventing the line, to which the driver device is connected, from being energized during line selection, each line-disabling circuit comprising a programmable device for selectively disabling the line,
wherein the programmable devices are programmed by the driver devices.

2. The memory device of claim 1, wherein each of the line-disabling circuits is programmably actuable.

3. The memory device of claim 1, wherein each of the line-disabling circuits comprises a discharge path preventing the associated line from being energized.

4. The memory device of claim 1, wherein at least one line-disabling circuit is configured to enable a previously disabled line.

5. The memory device of claim 1, wherein each line-disabling circuit comprises at least one of an antifuse, a fuse, a floating-gate device, or a phase-change device.

6. The memory device of claim 1, wherein the decoder circuit comprises a pattern of diodes.

7. The memory device of claim 1, further comprising, intersecting the plurality of lines, a second plurality of generally parallel lines, each storage location being disposed proximate an intersection point.

8. The memory device of claim 7, further comprising, intersecting the plurality of lines and the second plurality of lines, a third plurality of generally parallel lines.

9. The memory device of claim 1, wherein the memory array is a single block of a multiple-block memory circuit.

10. The memory device of claim 9, wherein the memory circuit has a three-dimensional topology.

11. A method of operating a memory array comprising a plurality of storage locations disposed along a plurality of lines, each line being connected to a driver device, each driver device being connected to a line-disabling circuit comprising a programmable device (i) corresponding to the line and (ii) for selectively disabling the line, the method comprising:
disabling at least one line by programming the at least one programmable device corresponding to the at least one line, each programmable device being programmed by the driver device to which it is connected;

applying a voltage to the plurality of driver devices such that charge is stored at the driver devices, current not flowing through the at least one disabled line thereduring; and selecting a single line such that the charge stored at the driver devices enables application of voltage to the single line.

12. The method of claim 11, further comprising, after selecting the single line, enabling the at least one disabled line.

13. The method of claim 11, wherein disabling the at least one line comprises fusing an antifuse connected thereto.

14. The method of claim 11, further comprising, prior to disabling the at least one line, identifying the at least one line as defective.

15. The method of claim 11, further comprising selecting a single second line intersecting the selected line in order to read or write information at a storage location disposed proximate the intersection point.

16. A method of forming a memory device, the method comprising:

forming a memory array comprising a plurality of storage locations disposed along a plurality of generally parallel lines;

forming, connected to each of the plurality of lines, a driver device for energizing the line connected thereto;

forming a decoder circuit for selecting one of the driver devices connected to a line to energize; and forming, connected to each of the driver devices, a line-disabling circuit for selectively preventing the line, to which the driver device is connected, from being energized during line selection, each line-disabling circuit comprising a programmable device for selectively disabling the line, wherein the programmable devices are programmed by the driver devices.

17. The memory device of claim 1, wherein the memory array is programmed with data comprising at least one of music, video, computer software, a computer application, reference data, text, or a diagram.

18. The memory device of claim 1, wherein the memory device is at least a portion of a removable memory device.

* * * * *